(12) United States Patent
Ashton et al.

(10) Patent No.: US 6,362,638 B1
(45) Date of Patent: Mar. 26, 2002

(54) STACKED VIA KELVIN RESISTANCE TEST STRUCTURE FOR MEASURING CONTACT ANOMALIES IN MULTI-LEVEL METAL INTEGRATED CIRCUIT TECHNOLOGIES

(75) Inventors: Robert Alan Ashton; Steven Alan Lytle; Mary Drummond Roby; Daniel Joseph Vitkavage, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/388,203

(22) Filed: Sep. 1, 1999

(51) Int. Cl.⁷ .............................................. G01R 31/26
(52) U.S. Cl. ..................................... 324/755; 324/158.1
(58) Field of Search .................................. 324/715, 754, 324/755, 758, 765, 158.1

(56) References Cited

U.S. PATENT DOCUMENTS

| | | | |
|---|---|---|---|
| 5,157,255 A | * 10/1992 | Kornrumpf et al. | 250/252.1 |
| 5,302,547 A | * 4/1994 | Wojnarowski et al. | 437/173 |
| 5,514,974 A | 5/1996 | Bouldin | |
| 5,627,101 A | * 5/1997 | Lin et al. | 324/765 X |
| 5,838,161 A | * 11/1998 | Akram et al. | 324/755 |
| 5,846,871 A | 12/1998 | Lee et al. | |
| 6,246,010 B1 | * 6/2001 | Zenner et al. | 174/260 |

* cited by examiner

Primary Examiner—Safet Metjahic
Assistant Examiner—T. R. Sundaram
(74) Attorney, Agent, or Firm—Alston & Bird LLP

(57) ABSTRACT

A method and apparatus for measuring Kelvin contact resistance within an integrated circuit interconnect is provided, having upper and lower Kelvin contact resistance contacts covering a via and interconnect being measured, along with a third conductor placed substantially between the upper and lower Kelvin contacts, and in contact with the via.

18 Claims, 5 Drawing Sheets

US 6,362,638 B1

STACKED VIA KELVIN RESISTANCE TEST STRUCTURE FOR MEASURING CONTACT ANOMALIES IN MULTI-LEVEL METAL INTEGRATED CIRCUIT TECHNOLOGIES

FIELD OF THE INVENTION

The present invention relates generally to integrated circuit manufacture and specifically to test methods and test structures for evaluating electrical characteristics of interconnects used in semiconductors.

BACKGROUND OF THE INVENTION

In integrated circuit (IC) technologies, contact resistance can be effected by the geometry of the metal levels present in the circuit due to a variety of physical effects. For example, the misalignment of vias with respect to small metal features, resist pull back from the edge of large metal features, dielectric thickness variations due to local and extended topography, and small metal features printing smaller than intended all may affect contact resistance. Circuit performance and life is dependent upon predictable and constant performance with regard to resistance and capacitance. Therefore, variation in the resistance can adversely affect the entire circuit and cause integrated circuit failure. To monitor the circuit, integrated circuits often contain self-monitoring capabilities to detect abnormalities or non-uniformity in terms of capacitance and resistance. However, even slight variations, which are difficult to detect, can result in circuit failure over time. Unfortunately, present integrated measurement techniques are not able to quantify small anomalies and irregularities in contact resistance.

There are two standard methods of measuring contact resistance between conductor levels. First, there is the so-called "chain" method of testing many contacts and series. Another useful measurement technique is known as the Kelvin contact resistance measurement.

Contact chains always have excess resistance in the series which masks the effect being studied to a certain degree. Kelvin contact resistance measurements measure the contact resistance without adverse effects of series resistance (chain method). However, the Kelvin contact resistance technique has special geometry considerations which limit the technique from being used with certain studies.

SUMMARY OF THE INVENTION

In one embodiment, the present invention relates to a method for measuring contact resistance between conductors in an integrated circuit using upper and lower Kelvin contact resistance conductors and further comprising an intermediate metal layer positioned between the upper and lower Kelvin conductors.

In a further embodiment, the present invention relates to a Kelvin resistance test structure in an integrated circuit used to measure contact anomalies in multi-level metal integrated circuits. The test structure comprises conventional Kelvin contact resistance conductors above and below the interconnect being tested, along with a new metal layer positioned between the first and second metal pad connectors.

In a still further embodiment, the present invention is directed to a method for measuring contact resistance of an interconnect in a semiconductor. Upper and lower Kelvin contact resistance conductors are provided within substrates, with a novel intermediate conductor positioned horizontally between the two Kelvin conductors.

In still a further embodiment, the present invention is directed to a semiconductor having an interconnect comprising a substrate having a via extending there through. The via contacts upper and lower Kelvin contact resistance conductors, and a third intermediate conductor located vertically between the upper and lower Kelvin contact resistance conductors to measure contact resistance.

DETAILED DESCRIPTION OF THE INVENTION

Figure 1:
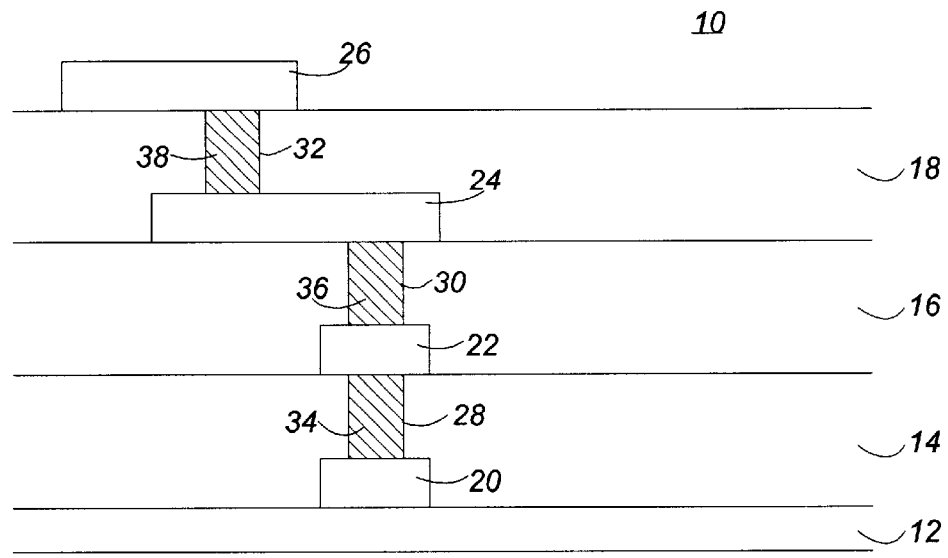
FIG. 1 is a cross-sectional schematic representation of an IC showing vias bounded by metal connectors.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. FIG. 1 shows an enlarged cross-sectional view of an IC in a semiconductor 10. Substrate 12 has dielectric layers 14, 16 and 18 stacked thereon. Metal connectors 20, 22, 24 and 26 are shown contacting respectively vias or windows in the dielectrics 28, 30 and 32 that are filled with conductive plugs 34, 36 and 38.

Figure 2:
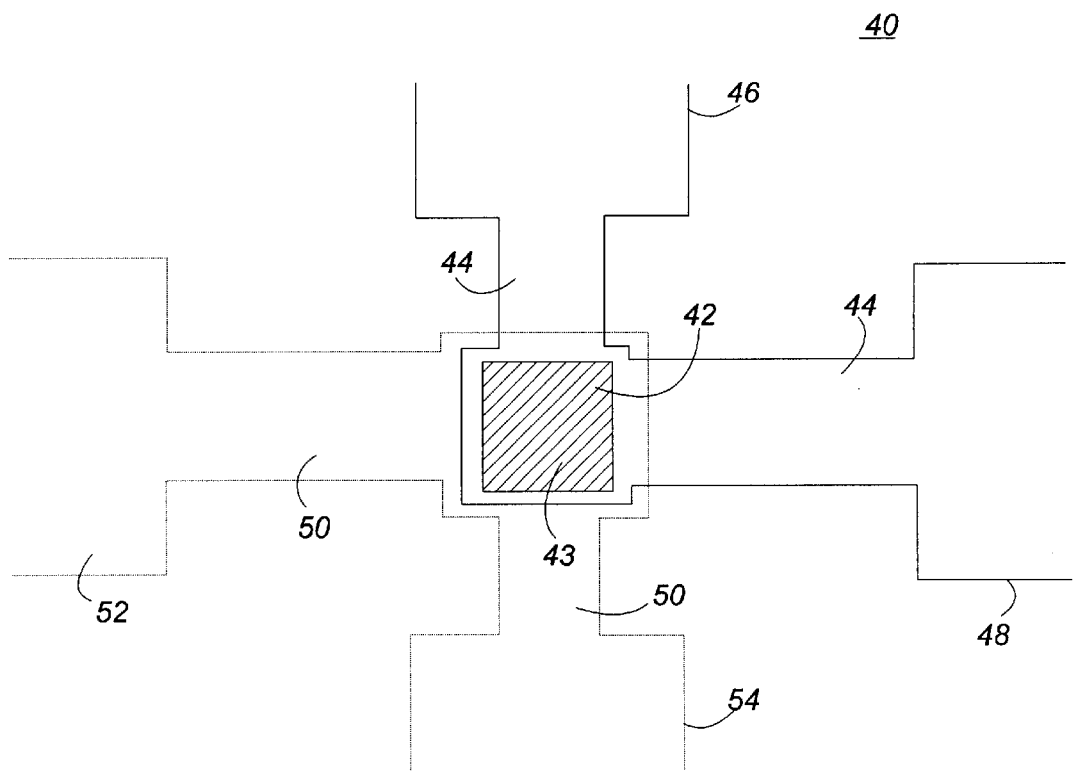
FIG. 2 is a plan view of a schematic representation of a conventional Kelvin contact resistance structure showing metal test connectors over (solid line) and under (phantom line) a via.
Figure 3:
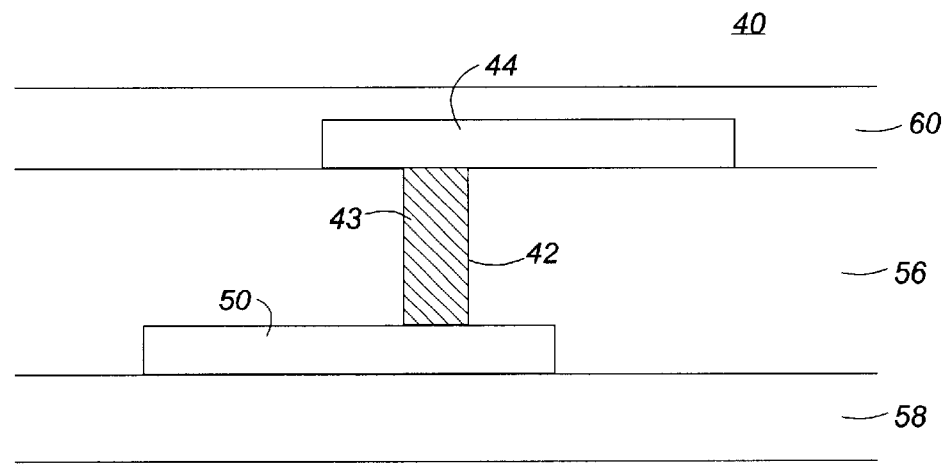
FIG. 3 is a cross-sectional schematic representation of a conventional Kelvin contact resistance structure similar to that shown in FIG. 2 showing vias bounded by a Kelvin contact resistance circuit.

FIG. 2 shows a plan view of a schematic representation of an integrated circuit 40 centered over a via 42 filled with a conductor 43. One circuit path travels over the upper level conductor 44 shown in a solid line and oriented over the via. The ends 46, 48 of conductor 44 are connected to pads not shown. Another circuit path travels over lower level conductor 50 shown by phantom lines and located beneath the via 42. Conductor 50 has ends 52, 54 connected to pads not shown. The array of FIG. 2 is shown in representative cross-section in FIG. 3. Dielectric layers 56, 60 are shown formed on substrate 58 of integrated circuit 40. Via 42 is formed in layer 56 and contacting upper conductor level 44 and lower conductive level 50 of the conventional Kelvin contact resistance test circuit. For the conventional Kelvin contact resistance method to work properly, the conductors which come in contact with the via must be similar in size to the via or interconnect being tested. Further, the extensions of the conductors around the via should be small. These restrictions reduce the types of geometries that can be studied with the Kelvin contact resistance structure.

Figure 4:
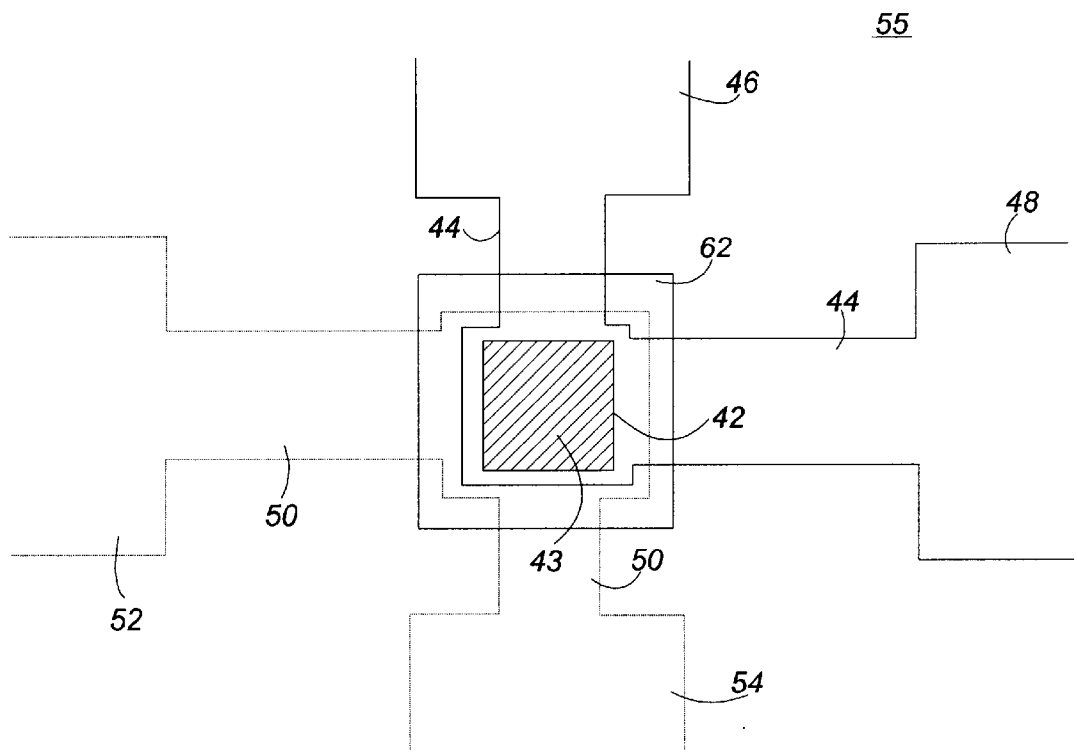
FIG. 4 is a plan view of a schematic representation of a test structure of the present invention showing a Kelvin contact resistance circuit over vias within an intermediate conductor.
Figure 5:
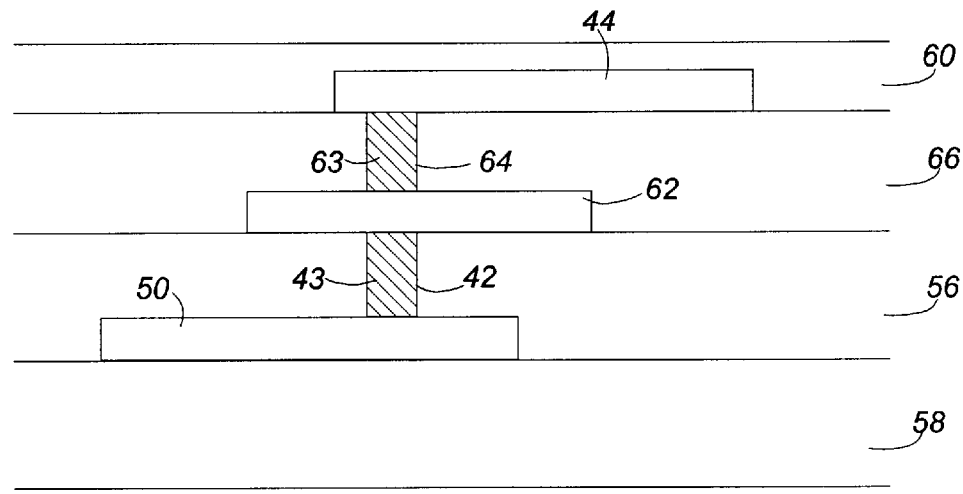
FIG. 5 is a cross-sectional view of a schematic representation of the IC of FIG. 4 showing the intermediately positioned metal positioned between the upper and lower Kelvin contact resistance metal strips.
Figure 8:
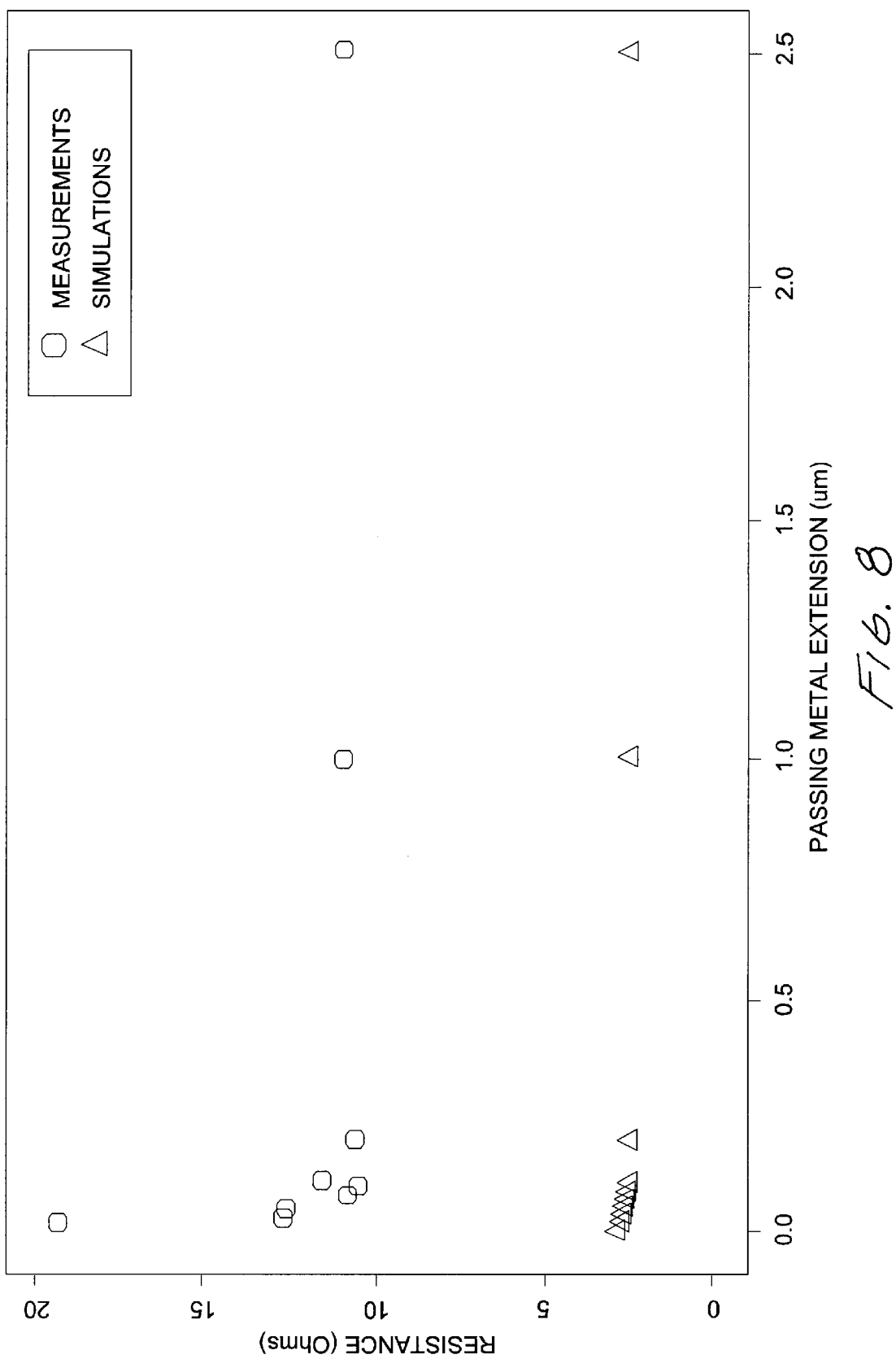
FIG. 8 is a graph showing plots of a computer simulation and measurement of the test structure of FIG. 4.

FIGS. 4 and 5 depict one embodiment of the present invention. The conventional Kelvin contact resistance test circuit of FIG. 2 has an improvement whereby an intermediate conductive plate 62 is oriented in a layer between upper and lower level conductors 44, 50 respectively. Substrate 58 of integrated circuit 55 has dielectric layers 56, 66 and 60 formed thereon. Upper level conductor 44 of the Kelvin circuit resides in dielectric layer 60. Via 64 extends through dielectric layer 66 and contacts upper conductive level 44 of the Kelvin test circuit and the intermediate conductive plate 62 of the novel, modified Kelvin test circuit. Via 42 extends through dielectric layer 56 and contacts intermediate conductive plate 62 and lower level conductor 50 of the Kelvin circuit. The new "stacked" via structure just described and shown in the figures allows the requirements of the Kelvin contact resistance structure to be met by the conventional upper and lower conductors. There are minimal restrictions on the intermediate conductor. Current will predominantly flow vertically through the intermediate metal layer and the size of the intermediate layer will have little effect on the measured resistance so long as the intermediate layer is larger than the via size. This is seen in FIG. 8 for both a computer simulation and a measurement of the test structure. The variable is the extension of the intermediate layer beyond the vias. Even in situations where the small size of the intermediate layer or extreme misalignment makes the measurement sensitive to specific geometries, three-dimensional simulations can be used to calibrate the geometry effects. Deviations from the simulated geometry effects can then be attributed to physical effects of interest.

Figure 6:
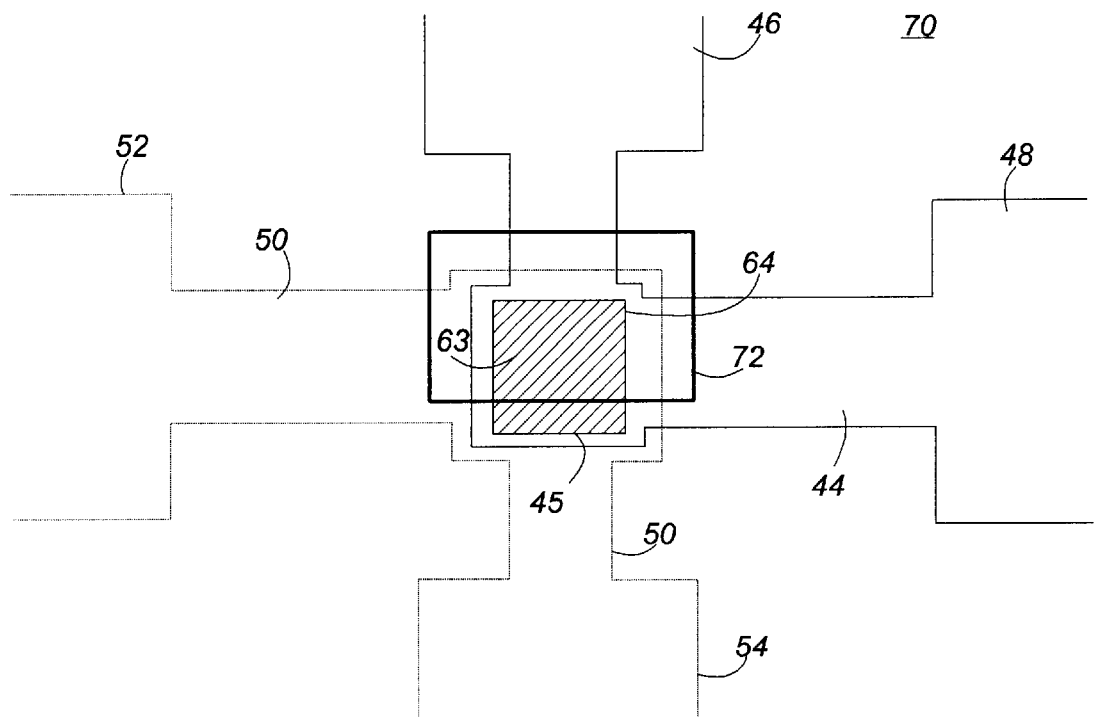
FIG. 6 is a plan view of a schematic representation of an IC having an intermediately positioned metal conductor positioned between upper and lower Kelvin contact resistance strips testing for the effect of misalignment.
Figure 7:
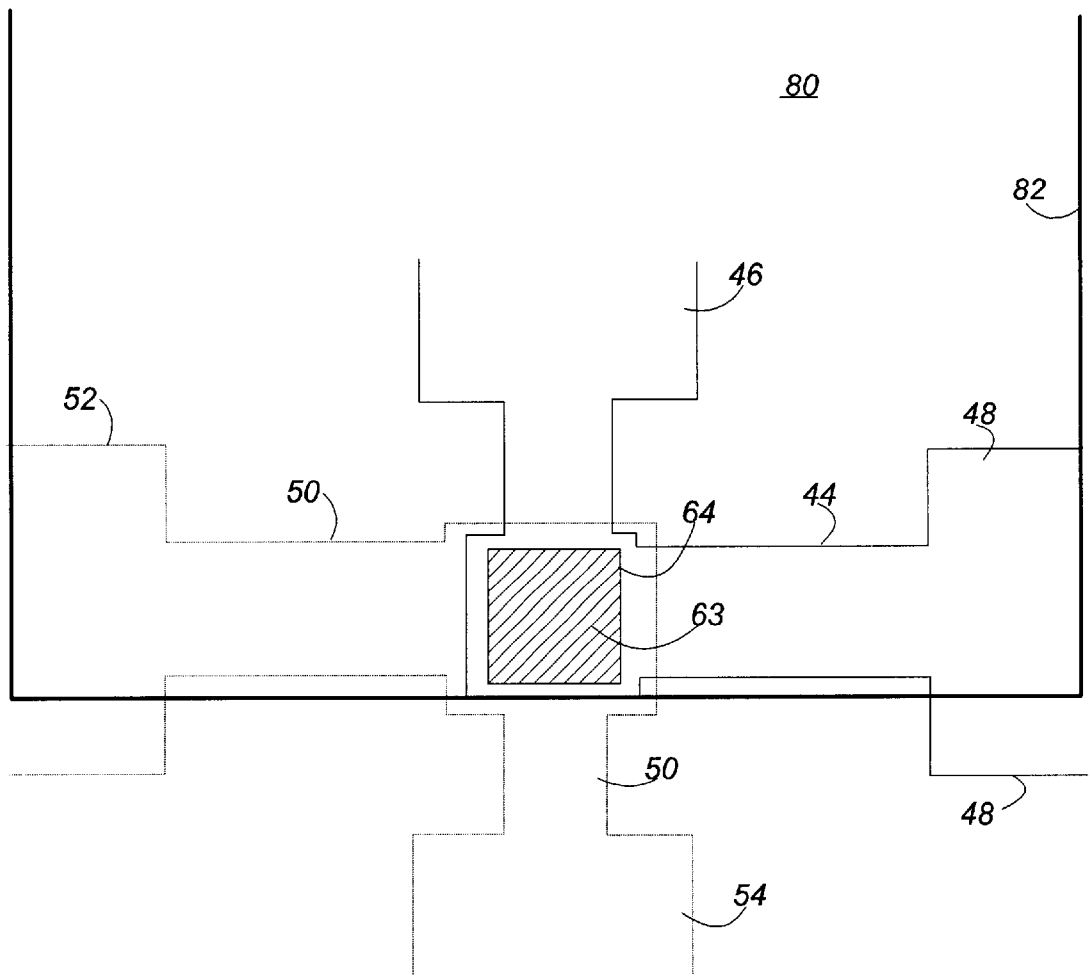
FIG. 7 is a plan view of a schematic representation of an IC showing the intermediate metal strip in the Kelvin contact resistance circuit of the present invention testing for edge of large metal effect.

The shape of the intermediate metal layer of the present invention is arbitrary and can measure a variety of effects including, the effect of layer or misalignment of small metal features, the effect of size of the intermediate metal, or the effect of contacting near the edge of a large metal figure. FIGS. 6 and 7 show schematic plan view representations of alternative embodiments of the present invention. The intermediate plate feature of the present invention can be modified to isolate testing abilities of the Kelvin test circuit. For example, as shown in FIG. 6, IC 70 depicts upper level conductor 44 (solid line) and lower level conductor 50 (phantom line) oriented respectively above and below via stack 42 and 64. The rectangular intermediate conductor plate 72 is disposed horizontally between the upper and lower level conductors 44, 50. The conductors are all in contact with the conductive materials 43 and 63 filling vias 42 and 64. According to the present invention, the shape and size of the intermediate metal is arbitrary and can measure a variety of effects including the effect of misalignment of the via with respect to the intermediate metal 72. FIG. 7 shows the use of the present test method invention whereby the present modified Kelvin contact resistance test circuit can test for the effects on a circuit of large metal connectors compared to small metal connectors. In some IC circuits performance can be affected by having a large disparity between the amount of metal present in different levels within layers of an IC. As shown in FIG. 7 a large intermediate conductor plate 82 is used in test structure 80. The plate 82 is oriented between upper and lower level conductors 44, 50 as described above.

The novel structures of the present invention remove the geometry constraints normally associated with Kelvin contact resistance testing methods by using three rather than two levels of conductor. The top and bottom levels follow the constraints of a Kelvin contact resistance measurement. However, the intermediate layer can have a modifiable arbitrary geometry.

The modified Kelvin test circuits of the present invention are integrated within ICs and allow for the measurement of the contact resistance to special conductor geometries which would not be possible with conventional Kelvin structures or without a series of extraneous series resistance testing features. The integrated test structures of the present invention allow for enhanced integrated circuit monitoring which improves the overall quality of the chip and the device serviced by the chip since a malfunction will be detected earlier allowing for the implementation of planned replacement protocols. In this way industrial down time and expense is reduced resulting in increased overall system productivity.

According to one preferred embodiment of the present invention, current is forced from one arm of the upper conductor, through the upper substrate via, through the intermediate conductor, past the lower substrate via and out one arm in the lower conductor. The arm in the lower conductor is positioned opposite the arm in the upper conductor from which the current came. The voltage is measured between the remaining arms in the upper and lower conductors, allowing the resistance of the contacts to be calculated by dividing the measured voltage by the forced current.

An example of simulations and measurements with the structure of the present invention is shown in FIG. 8. The figure shows the effect on the measured resistance of the extension of the intermediate metal beyond the via dimensions. Both the simulations and measurements show that the measured resistance is not effected by the extension of the metal beyond a few tenths of a micron. The magnitude difference between the simulated values (which assume bulk resistivities) and the measured values indicates that the presence of physical effects beyond bulk resistance contribute to the contact resistance. The increased magnitude of the measured contact resistances at small extensions, relative to the size of the increased resistance which would be expected from simulation, demonstrate a loss of process control for these small metal features, or some other effect that is degrading the resistance.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for measuring contact resistance of an interconnect in an integrated circuit comprising:

providing an upper substrate having a via comprising an upper Kelvin contact resistance conductor;

providing a lower substrate having a via comprising a lower Kelvin contact resistance conductor;

providing an intermediate conductor, wherein said intermediate conductor comprises a cross section substantially greater than the cross section of an interconnect which the intermediate conductor contacts; and positioning the intermediate conductor between the upper and lower Kelvin contact resistance conductors, such that the intermediate conductor, upper Kelvin contact resistance conductor and lower Kelvin contact resistance conductor form a test circuit operable to measure the contact resistance of the interconnect.

2. The method of claim 1, wherein the upper and lower substrates further comprise additional conductors in contact with the via.

3. The method of claim 1, wherein the via is filled with a conductive material.

4. The method of claim 1, wherein the intermediate conductor is made from a conductive material.

5. The method of claim 4, wherein the conductive material is a metal.

6. The method of claim 1, wherein the intermediate conductor is dimensioned to measure misalignment of metal features within the interconnect.

7. The method of claim 1, wherein the intermediate conductor is dimensioned to measure the effect of an interconnect having conductors of varying dimensions.

8. A device comprising an integrated circuit tested according to the method of claim 1.

9. An integrated circuit having an integral Kelvin contact resistance testing interconnect comprising:

a substrate having a via extending through the substrate, said via contacting upper and lower Kelvin contact resistance conductors, and an intermediate conductor positioned horizontally between the upper and lower conductors, wherein said intermediate conductor is in contact with said via, and wherein said intermediate conductor comprises a cross section substantially greater than the cross section of the via.

10. The integrated circuit of claim 9, wherein the intermediate conductor bisects the via.

11. The integrated circuit of claim 10, wherein the intermediate conductor is dimensioned to cover the via.

12. The integrated circuit of claim 9, wherein the intermediate conductor is dimensioned to substantially cover the via.

13. The integrated circuit of claim 9, wherein the intermediate conductor has a surface area that is greater than or equal to the individual surface areas of the upper and lower Kelvin contact resistance conductors.

14. The integrated circuit of claim 9, wherein the dimension and geometry of the intermediate conductor differs from the dimension and geometry of the upper and lower Kelvin contact resistance conductors.

15. A device comprising the integrated circuit of claim 9.

16. A test structure for measuring contact resistance of an interconnect in an integrated circuit comprising:

an upper substrate having an upper via covered by an upper Kelvin contact resistance conductor;

a lower substrate having a lower via covered by a lower Kelvin contact resistance conductor; and an intermediate conductor positioned horizontally between the upper and lower Kelvin contact resistance conductors and comprising a cross section greater than the cross section of at least one of the upper via and the lower via.

wherein current is directed from a first arm of the upper conductor through the upper via, the intermediate conductor the lower via and along a first arm in the lower conductor, said lower conductor first arm positioned opposite the upper conductor first arm, with voltage measured between remaining arms in the upper and lower conductors.

17. A device comprising the test structure of claim 16.

18. The test structure of claim 9, wherein the intermediate conductor is at least partially displaced from the via such that the intermediate conductor extends further from the via in a first direction than in a second direction.

* * * * *